United States Patent
Banerjee et al.

(10) Patent No.: US 9,664,762 B2
(45) Date of Patent: May 30, 2017

(54) SYSTEM AND METHOD FOR REDUCED FIELD OF VIEW MAGNETIC RESONANCE IMAGING

(71) Applicant: General Electric Company, Schenectady, NY (US)

(72) Inventors: Suchandrima Banerjee, Berkeley, CA (US); Emine Ulku Saritas, Ankara (TR)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 542 days.

(21) Appl. No.: 14/258,376

(22) Filed: Apr. 22, 2014

(65) Prior Publication Data

US 2015/0301143 A1 Oct. 22, 2015

(51) Int. Cl.
*G01R 33/483* (2006.01)
*G01R 33/561* (2006.01)
*G01R 33/563* (2006.01)

(52) U.S. Cl.
CPC ..... *G01R 33/4835* (2013.01); *G01R 33/4836* (2013.01); *G01R 33/561* (2013.01); *G01R 33/5615* (2013.01); *G01R 33/56341* (2013.01)

(58) Field of Classification Search
CPC ............ G01R 33/4835; G01R 33/4836; G01R 33/561; G01R 33/5615; G01R 33/56341
See application file for complete search history.

(56) References Cited

U.S. PATENT DOCUMENTS

| 5,923,168 A * | 7/1999 | Zhou ............... G01R 33/56554 324/307 |
| 2005/0110488 A1 | 5/2005 | Zhu |
| 2007/0167727 A1* | 7/2007 | Menezes .......... G01R 33/56341 600/410 |
| 2010/0213938 A1 | 8/2010 | Jeong et al. |
| 2010/0298692 A1* | 11/2010 | Schmainda ............ A61B 5/055 600/410 |
| 2012/0013336 A1 | 1/2012 | Hetzer et al. |
| 2013/0249548 A1 | 9/2013 | Stemmer |

FOREIGN PATENT DOCUMENTS

JP 2009-125582 A 6/2009

OTHER PUBLICATIONS

International Search and Written Opinion for International Application No. PCT/US2015/025543 filed Apr. 13, 2015, 5 pages.
Saritas, E.U, et al., "Hadamard Slice Encoding for Reduced FOV Single-Shot Diffusion Weighted EPI," ISMRM 17, 2009, 1382.
Saritas, E.U, et al., "Hadamard Slice Encoding for Reduced FOV Single-Shot Diffusion Weighted EPI," ISMRM 18, 2010, 189.

* cited by examiner

*Primary Examiner* — Rodney Bonnette

(57) ABSTRACT

A method for reduced field of view magnetic resonance (MR) imaging includes applying a pulse sequence using a plurality of gradient coils and at least one RF coil of a magnetic resonance imaging system. The pulse sequence includes a two dimensional (2D) echo-planar RF excitation pulse with a plurality of side lobes along a slice select axis and a multiband RF refocusing pulse. MR data is acquired in response to the application of the pulse sequence and at least one MR image is reconstructed based on the MR data. The at least one MR image may then be displayed.

20 Claims, 6 Drawing Sheets

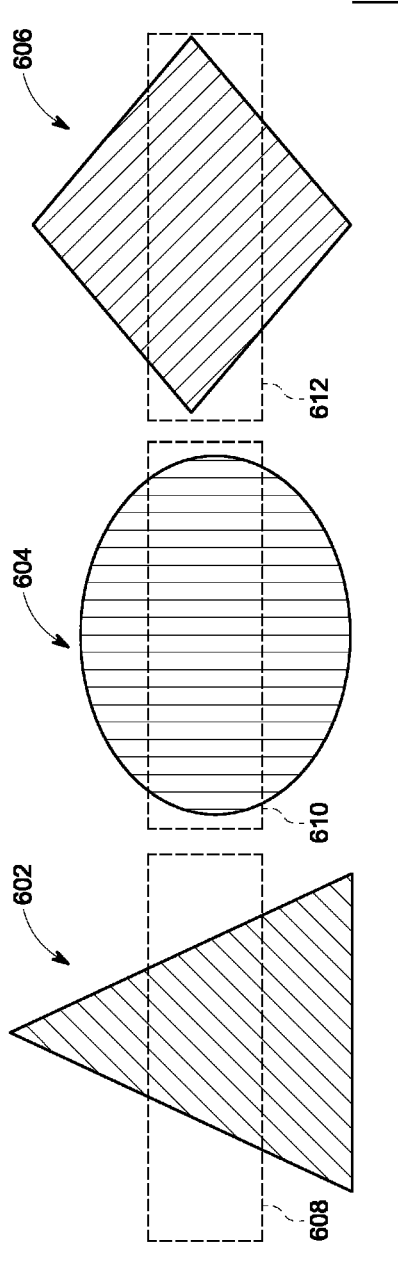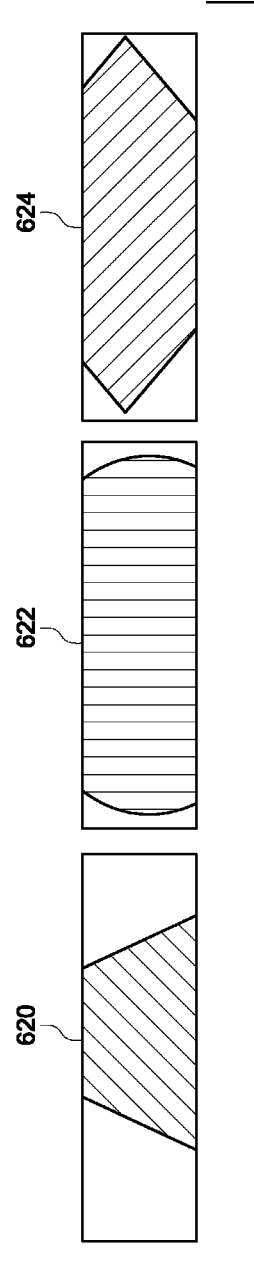
FIG. 6A
FIG. 6B

SYSTEM AND METHOD FOR REDUCED FIELD OF VIEW MAGNETIC RESONANCE IMAGING

FIELD OF THE INVENTION

The present invention relates generally to a magnetic resonance imaging (MRI) system and in particular to a system and method for reduced field of view magnetic resonance imaging.

BACKGROUND OF THE INVENTION

Magnetic resonance imaging (MRI is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the z, y or x axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MR images may be created by applying currents to the gradient and RF coils according to known algorithms called "pulse sequences." The selection of a pulse sequence determines the relative appearance of different tissue types in the resultant images. Various properties of tissue may be used to create images with a desirable contrast between different tissues. Many specific techniques have been developed to acquire MR images for a variety of applications. In order to reduce the time required to perform MR examinations, pulse sequences have been developed that permit extremely rapid acquisitions of a large amount of data. Time reductions are particularly important for acquiring high resolution images as well as for suppressing motion effects and reducing the discomfort of patients in the examination process. Dramatic reductions in acquisition time have been obtained through a technique referred to as echo planar imaging (EPI). In EPI, a bi-polar gradient waveform is used concurrently with the echo-train acquisition. Each echo in the echo train in individually phase-encoded, usually by a small blip gradient pulse, to produce a line of k-space data. In doing so, multiple k-space lines can be acquired in a single excitation. The k-space lines acquired in a single excitation can be used to reconstruct an image, a technique known as "single shot EPI."

In certain clinical applications, it is desirable to acquire "diffusion weighted" images in which tissues that have either higher or lower water self-diffusion characteristics relative to other tissues are emphasized. Typically, diffusion weighting is implemented using a pair of large gradient pulses bracketing a refocusing RF pulse. The diffusion weighting gradient sensitizes the MR signals to the diffusion of water molecules which can be subsequently used as a contrast mechanism to distinguish different tissues. Diffusion weighted imaging has been combined with EPI techniques (DW-EPI) and many clinical diffusion weighted imaging applications are performed using a single-shot sequence, such as single-shot echo-planar imaging (ss-EPI). For example, diffusion weighted imaging (DWI) is being increasingly adopted in routine clinical MR scans to assess the development or degeneration of tissue microstructures.

Reduced field of view (rFOV) approaches have been developed as a way to achieve single shot echo-planar (ss-EPI) diffusion weighted imaging (DWI) with acceptable imaging distortion in susceptibility-prone anatomies and as an enabler for high resolution DWI. A two-dimensional (2D) spatially selective echo-planer (EP) RF excitation pulse with blipped gradients along the slice select axis may be used to achieve reduced field of view by exciting a limited extent in the phase field-of-view direction. Such an rFOV excitation can also be beneficial for other sequences with extended echo trains such as fast spin echo. However, one challenge with such an approach has been the limited slice coverage provided per acquisition. Concerns about, for example, partial saturation in slice locations that may overlap with the periodic side lobe locations of the RF excitation profile limit slice coverage to the number of slices that can be accommodated within the distance between the periodic side lobes of the RF excitation profile. In many applications, such as axial DWI of the spine or breast, this does not provide sufficient coverage.

It would be desirable to provide a system and method for reduced field of view MR imaging that increases the slice coverage by using a multiband RF refocusing pulse. Reconstruction techniques such as parallel imaging may be applied for resolving signal from simultaneously acquired slices utilizing the coil sensitivity differences between the simultaneously acquired slice locations.

BRIEF DESCRIPTION OF THE INVENTION

In accordance with an embodiment, a magnetic resonance (MR) imaging system includes a resonance assembly including a magnet, a plurality of gradient coils and at least one radio frequency (RF) coil, an RF transceiver system coupled to the at least one RF coil and configured to receive MR data from the at least one RF coil and a controller coupled to the resonance assembly and the RF transceiver system and programmed to apply a pulse sequence using the plurality of gradient coils and the at least one RF coil, the pulse sequence including a two dimensional (2D) echo-planar RF excitation pulse with a plurality of side lobes along a slice select axis and a multiband RF refocusing pulse, acquire MR data in response to the application of the pulse sequence, wherein the MR data corresponds to a plurality of slice locations, reconstruct a reduced field-of-view MR image for each slice location based on the MR data, and display the MR images.

In accordance with another embodiment, a method for reduced field of view magnetic resonance (MR) imaging includes applying a pulse sequence using a plurality of gradient coils and at least one RF coil, the pulse sequence including a two dimensional (2D) echo-planar RF excitation pulse with a plurality of side lobes along a slice select axis and a multiband RF refocusing pulse, acquiring MR data in response to the application of the pulse sequence, wherein the MR data corresponds to a plurality of slice locations, reconstructing a reduced field-of-view MR image for each slice location based on the MR data, and displaying the MR images.

In accordance with another embodiment, a non-transitory computer readable storage medium having computer executable instructions for performing a method for reduced field of view magnetic resonance (MR) imaging, includes program code for applying a pulse sequence using the plurality of gradient coils and the at least one RF coil, the pulse sequence including a two dimensional (2D) echo-planar RF excitation pulse with a plurality of side lobes along a slice select axis and a multiband RF refocusing pulse, program code for acquiring MR data in response to the application of the pulse sequence, wherein the MR data corresponds to a plurality of slice locations, program code for reconstructing a reduced field-of-view MR image for each slice location based on the MR data, and program code for displaying the MR images.

BRIEF DESCRIPTION OF THE DRAWINGS

The invention will become more fully understood from the following detailed description, taken in conjunction with the accompanying drawings, wherein the reference numerals refer to like parts in which:

FIG. 6A illustrates an exemplary reduced field-of-view graphical prescription at three slice locations of an object in accordance with an embodiment; and FIG. 6B illustrates exemplary reduced field-of-view images for the slice locations shown in FIG. 6A in accordance with an embodiment.

DETAILED DESCRIPTION

Figure 1:
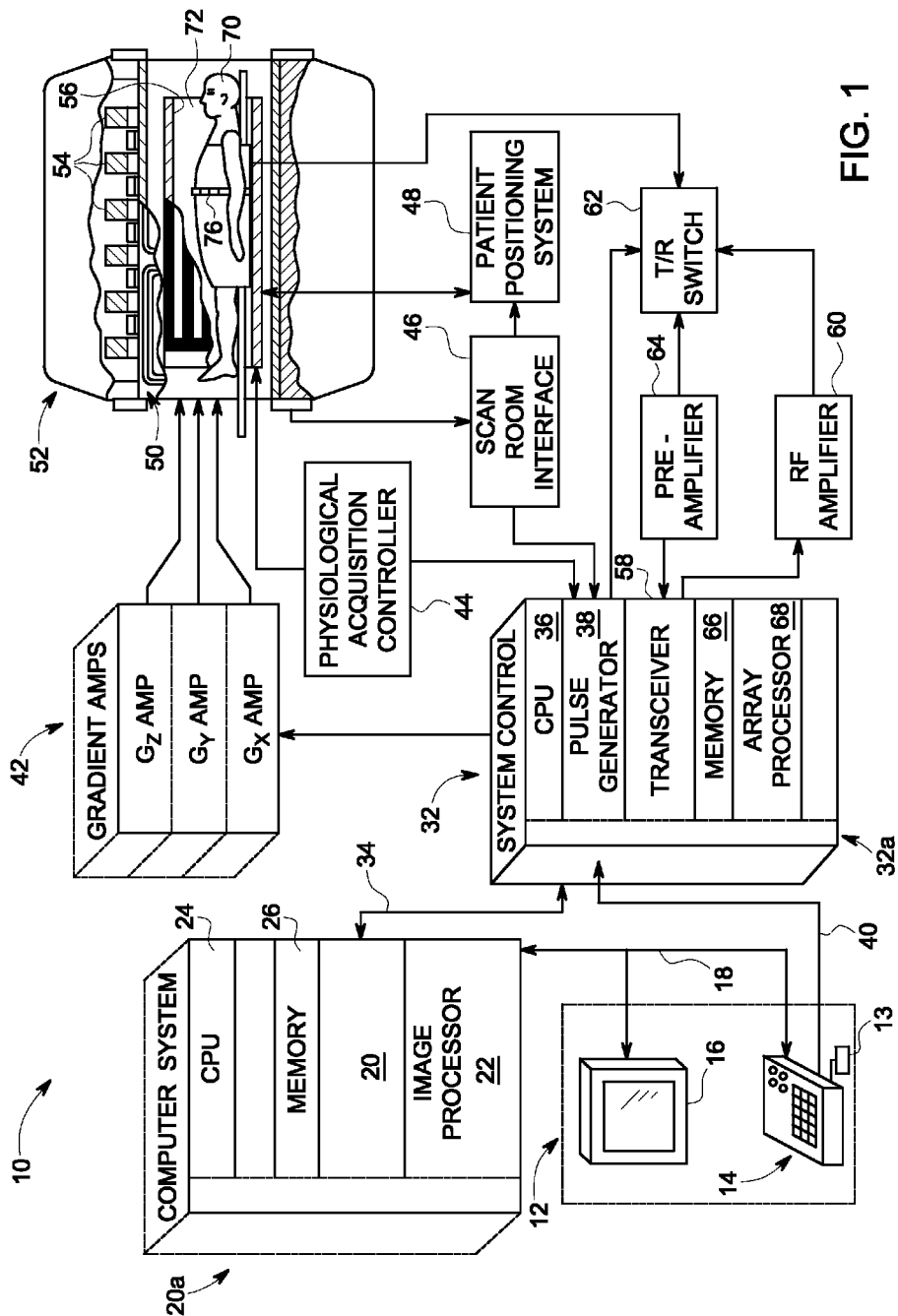
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connection 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communication link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operated the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands receive from the operator console 12 this image data may be archived in long term storage or it may be further processed by the image processor 22 and conveyed to the operator console 12 and presented on display 16.

Figure 2:
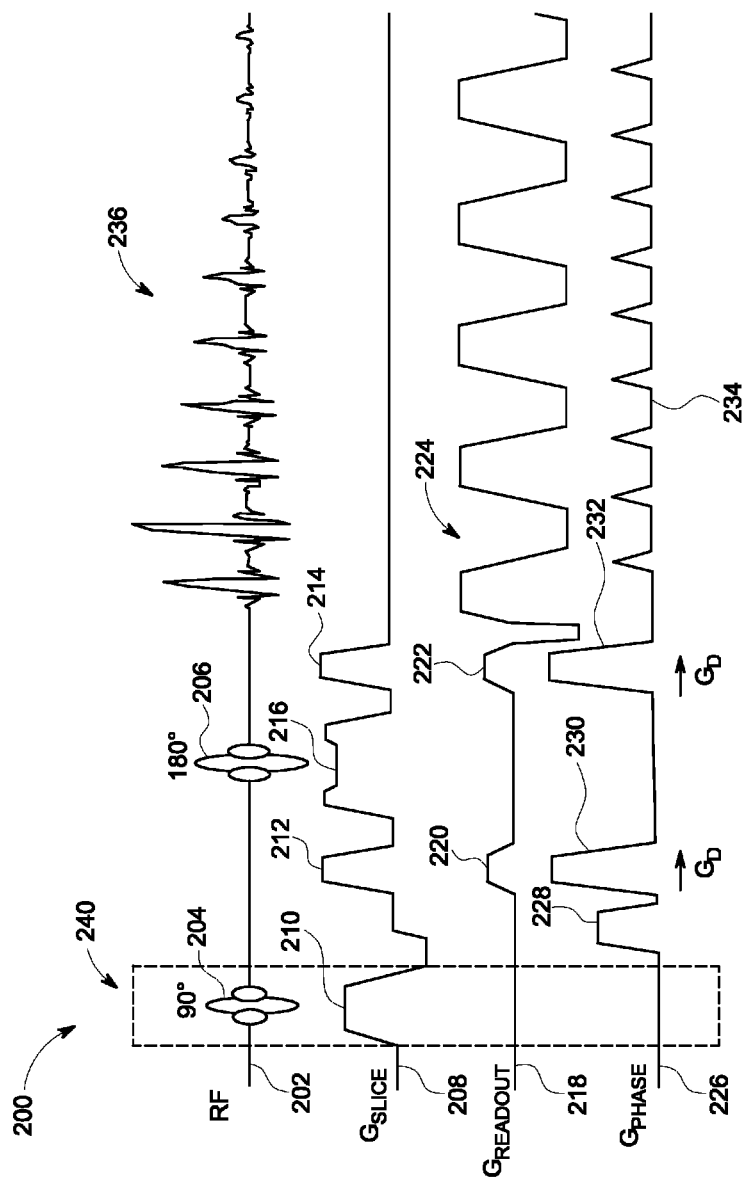
FIG. 2 is a graphical representation of an exemplary diffusion weighted echo-planar imaging (DW-EPI) pulse sequence in accordance with an embodiment.

FIG. 2 illustrates an exemplary diffusion weighted echo planar imaging (DW-EPI) pulse sequence in accordance with an embodiment. Pulse sequence 200 may be carried out on an MRI system such as, for example, MRI system 10 shown in FIG. 1. FIG. 2 includes an RF axis 202, a readout, or frequency encode, gradient axis 218 (e.g., an x-axis), a phase encode gradient axis 226 (e.g., a y-axis), and a slice select gradient axis 208 (e.g., a z-axis). Pulse sequence 200 is configured as a single shot diffusion weighted spin echo EPI sequence. A 90° RF excitation pulse 204 is produced to generate transverse magnetization in a region and material of interest. The RF excitation pulse 204 is played along with a slice selective gradient 210 in order to produce transverse magnetization in a plurality of imaging slices.

A 180° RF refocusing pulse 206 is produced in the presence of a slice select gradient pulse 216 to refocus the transverse magnetization and to produce a spin echo. Diffusion weighting is provided by applying diffusion gradients along the slice select 208, readout (or frequency encode) 218 and phase encode 226 axes. Along the slice select axis 208, a first diffusion gradient 212 is produced prior to the RF refocusing pulse 206 and a second diffusion gradient 214 is produced after the RF refocusing pulse 206. Along the readout (or frequency encode) axis 218, a first diffusion gradient 220 is produced prior to the RF refocusing pulse 206 and a second diffusion gradient 222 is produced after the RF refocusing pulse 206. Along the phase encode axis 226, a first diffusion gradient 230 is produced prior to the RF refocusing pulse 206 and a second diffusion gradient 232 is produced after the RF refocusing pulse 206. Along each axis 208, 218, 226, respectively, the first diffusion gradients 212, 220, 230 and the second diffusion gradients 214, 222, 232 have an equal area and have the same polarity. The amplitude and other characteristics of the diffusion weighting gradients along a particular axis can be changed to measure diffusion along different directions as is known in the art.

A series of oscillating readout gradient pulses 224 are produced on the readout axis 218 to acquire MR signals. Each of the readout gradient pulses 224 oscillates in polarity to read a series of echoes 236. A first phase encoding gradient 228 is produced on the phase encode axis 226 followed by a series of pulses or "blips" 234. Each blip 234 is applied at a point where the readout gradients 224 cross the readout axis 218 (i.e., the zero crossings). The RF excitation pulse 204 and the RF refocusing pulse 206 may be produced by an RF coil such as RF coil 56 shown in FIG. 1. The various gradients may be produced by a gradient coil in a gradient coil assembly such as gradient coil assembly 50 shown in FIG. 1.

Figure 3:
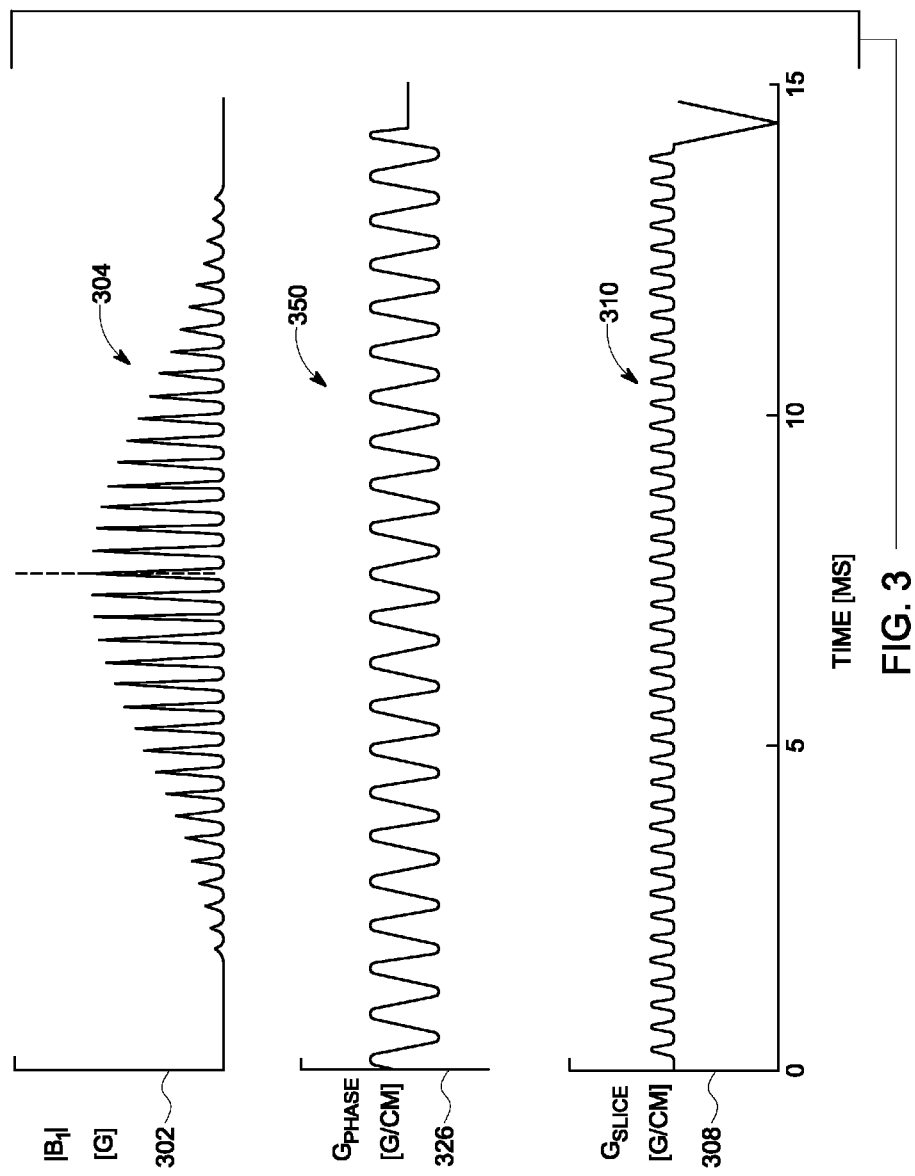
FIG. 3 illustrates an exemplary 2D echo-planar RF excitation pulse and gradients played out with the 2D echo-planar RF excitation pulse in accordance with an embodiment.

The design and characteristics of the RF excitation pulse and the corresponding gradient pulses, identified by dotted line box 240 in FIG. 2, may be configured to provide a reduced field-of-view examination. While the following discussion will refer to the exemplary DW-EPI pulse sequence shown in FIG. 2, it should be understood that the systems and methods described herein may be used with other pulse sequences with extended echo trains such as fast spin echo as well as with sequences other than diffusion weighted imaging sequences. To provide a reduced field-of-view excitation, RF excitation pulse 204 may be a 2D echo-planar RF excitation pulse. FIG. 3 illustrates an exemplary 2D echo-planar RF excitation pulse and the echo-planar gradients played out with the 2D echo-planar RF excitation pulse in accordance with an embodiment. RF excitation pulse 304 is a 2D echo-planar RF excitation pulse that is selective in both the phase encode and slice select directions. RF excitation pulse 304 has an echo-planar trajectory in k-space that is traversed by oscillating trapezoidal gradients 350 along a phase encode axis 326 and blipped gradients 310 along the slice select 308 axis.

Figure 4:
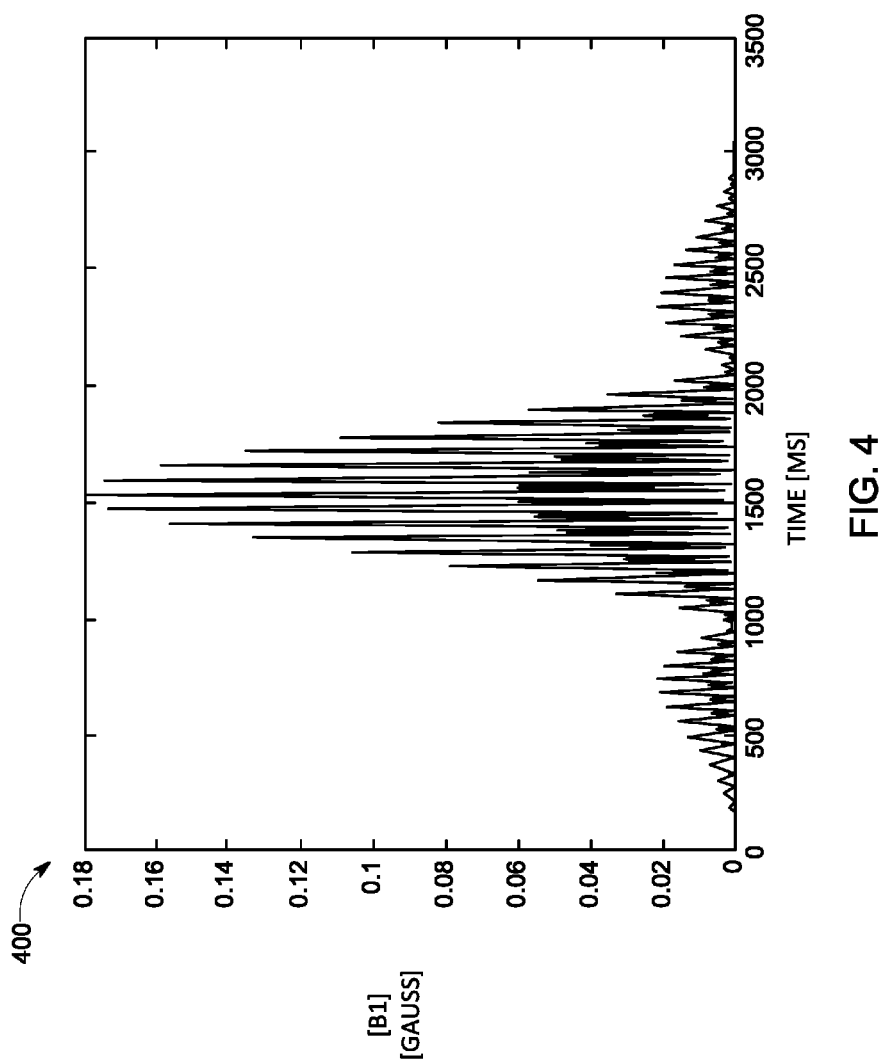
FIG. 4 illustrates an exemplary multiband RF refocusing pulse in accordance with an embodiment.

The 2D echo-planar RF excitation pulse 304 excites a main lobe (or main location) and nearby side lobes (or side locations). Typically, the RF refocusing pulse 206 shown in FIG. 2 refocuses only the main lobe of the 2D RF excitation profile. In that case, the slice coverage is limited to the number of slices that can be accommodated between two adjacent side lobes of the periodic 2D RF excitation profile. To increase the number of slices that can be imaged per acquisition and therefore, increase the through-plane anatomical coverage of the examination, the conventional 180° RF refocusing pulse 206 may be replaced with a multiband 180° RF refocusing pulse, such as multiband RF refocusing pulse 400 shown in FIG. 4. The multiband RF refocusing pulse refocuses the main lobe as well as multiple adjacent excitation side lobes of the 2D excitation profile. The multiband RF refocusing pulse is designed so that the distance between the locations simultaneously refocused by the multiband refocusing pulse (the "band separation distance") is equal to the separation distance between adjacent side lobes of the 2D echo-planar excitation pulse 304 (shown in FIG. 3). In addition, the 2D echo-planar RF excitation pulse in conjunction with the multiband RF refocusing pulse may suppress the signal from an off-resonant spectral species such as fat which experiences a chemical shift separation from on-resonant spectral species such as water. In various embodiments, the 2D echo-planar RF excitation pulse and the multiband RF refocusing pulse pair as described herein may be used in other pulse sequences such as 2D fast spin echo. FIG. 4 illustrates an exemplary multiband RF refocusing pulse in accordance with an embodiment. In FIG. 4, an exemplary three (3) band RF refocusing pulse 400 is shown. In one embodiment, the multiband RF refocusing pulse 400 may be designed by cosine modulating a conventional RF pulse, such as a SINC pulse. In another embodiment, known methods such as the Variable Rate Selective Excitation (VERSE) technique may be used to shorten the duration of the multiband RF refocusing pulse 400.

For each excitation, the main lobe and multiple excitation side lobe locations are simultaneously refocused and MR signal (or MR data) is simultaneously acquired from multiple slice locations. The MR signal (or MR data) may be received by RF coils such as RF coils 56, 76 shown in FIG. 1. In one embodiment, the simultaneously acquired MR signals from the multiple slice locations may be resolved and a reduced field-of-view image (or images) reconstructed for each slice location using known parallel imaging techniques such as SENSE (Sensitivity Encoding) and ARC (Autocalibrating Reconstruction for Cartesian Sampling). In an embodiment, a reduced field-of-view image may be reconstructed for each of the simultaneously acquired slice locations by utilizing the coil sensitivity differences between the simultaneously acquired slices. In an embodiment, the calibration data needed for the slice unfolding may be acquired separately for each individual slice location. The factor of increase of slice coverage achieved by using a 2D echo-planar RF excitation with a multiband RF refocusing pulse, as opposed to using a standard RF refocusing pulse, is equal to the number of bands in the multiband RF refocusing pulse. For example, if the 2D RF excitation pulse 304 is designed for a maximum of sixteen (16) slices and the multiband RF refocusing pulse 400 is a three (3) band refocusing pulse, a slice coverage of forty-eight (48) slices may be obtained in the same repetition time (TR).

Figure 5:
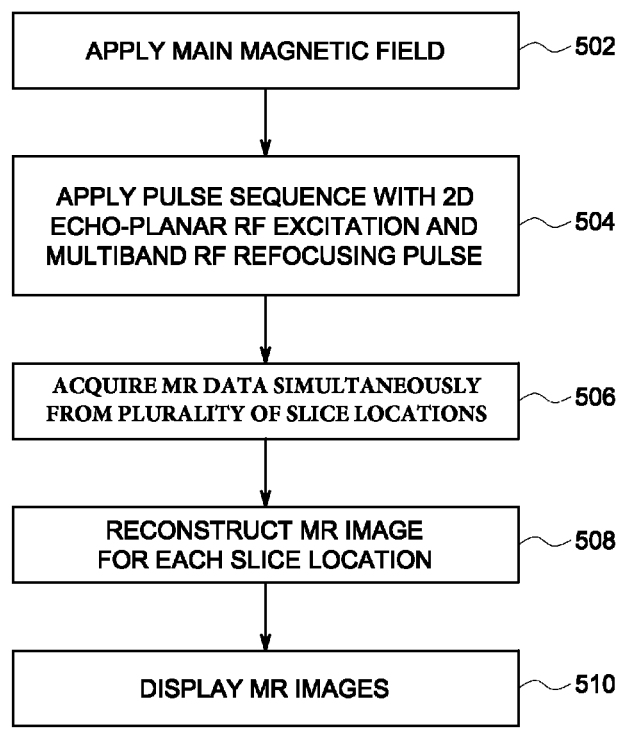
FIG. 5 illustrates a method for reduced field of view MR imaging in accordance with an embodiment.

FIG. 5 illustrates a method for reduced field-of-view MR imaging in accordance with an embodiment. At block 502, a main magnetic field is applied to a patient or subject, for example, using a magnet of a magnetic resonance imaging system such as magnet 54 shown in FIG. 1. At block 504, a pulse sequence with a 2D echo-planar RF excitation pulse and a multiband RF refocusing pulse is applied using the gradient coils and RF coils of a magnetic resonance imaging system, such as, gradient assembly 50 and RF coils 56, 76 shown in FIG. 1. The pulse sequence may be, for example, a single shot diffusion weighted EPI sequence, a 2DFSE sequence, or any other sequence employing an RF excitation and at least one RF refocusing excitation. As described above, the multiband RF refocusing pulse is used to increase the number of slices that may be imaged with the 2D echo-planar RF excitation. The multiband RF refocusing pulse refocuses the main lobe as well as the adjacent excitation side lobes of the 2D excitation profile. In addition, the pulse pair consisting of the 2D echo-planar RF excitation pulse and the multiband RF refocusing pulse may suppress the signal from fat.

Returning to FIG. 5, at block 506 MR data (or MR signals) from a plurality of slice locations is acquired in response to the application of the pulse sequence at block 504. For each excitation, the main lobe and multiple excitation side lobe locations are simultaneously refocused by the multiband RF refocusing pulse and MR signal (or MR data) is simultaneously acquired from multiple slice locations. The MR data may be received by RF coils of the magnetic resonance imaging system, such as RF coils 76 shown in FIG. 1. At block 508, a reduced field-of-view MR image is reconstructed for each of the simultaneously acquired slice locations based on the acquired MR data. In one embodiment, the simultaneously acquired MR signals from the multiple slice locations may be resolved and a reduced field-of-view image (or images) reconstructed using known parallel imaging techniques such as SENSE (Sensitivity Encoding) and ARC (Autocalibrating Reconstruction for Cartesian Sampling). In an embodiment, an image may be reconstructed for each of the simultaneously acquired slice locations by utilizing the coil sensitivity differences between the simultaneously acquired slices. At block 510, the MR image for each slice location may be displayed, for example, on a display of a magnetic resonance imaging system such as display 16 shown in FIG. 1.

FIG. 6A illustrates an exemplary reduced field-of view prescription at three slice locations of an object in accordance with an embodiment. FIG. 6B illustrates exemplary reduced field-of-view images for the slice locations shown in FIG. 6A in accordance with an embodiment. In FIG. 6A, a first slice location 602 of an object, a second slice location 604 of the object and a third slice location 606 of an object are shown. The desired target reduced field-of-view 608, 610, 612 for each of the three slices 602, 704, 606 is designated by the dotted line boxes. MR signals (or MR data) are simultaneously acquired from the target field-of-views 608, 610, 612 of the three slice locations by the application of a pulse sequence including a 2D echo-planar RF excitation pulse and a multiband RF refocusing pulse as described above. As shown in FIG. 6B, the MR data is used to reconstruct a reduced field-of-view image 620 of the first slice location 602, a reduced field-of-view MR image 622 of the second slice location 604 and a reduced field-of-view image 624 of the third slice location 606. Accordingly, a reduced field-of-view image may be reconstructed for each of the simultaneously acquired slice locations.

Computer-executable instructions for a method for reduced field of view magnetic resonance imaging according to the above-described method may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by system 10 (shown in FIG. 1), including by internet or other computer network form of access.

A technical effect of the disclosed system and method is that is provides for a computer implemented technique for reduced field of view MR imaging.

This written description used examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A magnetic resonance (MR) imaging system comprising:
a resonance assembly comprising a magnet, a plurality of gradient coils and at least one radio frequency (RF) coil;
an RF transceiver system coupled to the at least one RF coil and configured to receive MR data from the at least one RF coil; and
a controller coupled to the resonance assembly and the RF transceiver system and programmed to:
apply a pulse sequence using the plurality of gradient coils and the at least one RF coil, the pulse sequence comprising a two dimensional (2D) echo-planar RF excitation pulse with a plurality of side lobes along a slice select axis and a multiband RF refocusing pulse;
acquire MR data in response to the application of the pulse sequence, wherein the MR data corresponds to a plurality of slice locations;
reconstruct a reduced field-of-view MR image for each slice location based on the MR data; and
display the MR images.

2. A magnetic resonance imaging system according to claim 1, wherein the pulse sequence is a single shot echo planar pulse sequence.

3. A magnetic resonance imaging system according to claim 2, wherein the pulse sequence is a diffusion weighted pulse sequence.

4. A magnetic resonance imaging system according to claim 1, wherein a separation distance between bands of the multiband RF refocusing pulse is equal to a separation distance between adjacent side lobes of the 2D echo-planar RF excitation pulse.

5. A magnetic resonance imaging system according to claim 1, wherein the MR images are reconstructed using a parallel imaging technique.

6. A magnetic resonance imaging system according to claim 1, wherein the MR data for each of the plurality of slice locations is acquired simultaneously.

7. A magnetic resonance imaging system according to claim 1, wherein the 2D echo-planar RF excitation pulse and the multiband RF refocusing pulse are configured to suppress signal from a spectral species which experiences chemical shift separation from a resonant frequency.

8. A method for reduced field of view magnetic resonance (MR) imaging, the method comprising:
applying a pulse sequence using a plurality of gradient coils and at least one RF coil, the pulse sequence comprising a two dimensional (2D) echo-planar RF excitation pulse with a plurality of side lobes along a slice select axis and a multiband RF refocusing pulse;
acquiring MR data in response to the application of the pulse sequence, wherein the MR data corresponds to a plurality of slice locations;
reconstructing a reduced field-of-view MR image for each slice location based on the MR data; and
displaying the MR images.

9. A method according to claim 8, wherein the pulse sequence is a single shot echo planar imaging pulse sequence.

10. A method according to claim 9, wherein the pulse sequence is a diffusion weighted pulse sequence.

11. A method according to claim 8, wherein a separation distance between bands of the multiband RF refocusing pulse is equal to a separation distance between adjacent side lobes of the 2D echo-planar RF excitation pulse.

12. A method according to claim 8, wherein reconstructing the MR images comprises applying a parallel imaging technique.

13. A method according to claim 8, wherein the MR data for each of the plurality of slice locations is acquired simultaneously.

14. A method according to claim 8, wherein the 2D echo-planar RF excitation pulse and the multiband RF refocusing pulse are configured to suppress signal from a spectral species which experiences chemical shift separation from a resonant frequency.

15. A non-transitory computer readable storage medium having computer executable instructions for performing a method for reduced field of view magnetic resonance (MR) imaging, the computer readable storage medium comprising:
program code for applying a pulse sequence using the plurality of gradient coils and the at least one RF coil, the pulse sequence comprising a two dimensional (2D) echo-planar RF excitation pulse with a plurality of side lobes along a slice select axis and a multiband RF refocusing pulse;
program code for acquiring MR data in response to the application of the pulse sequence, wherein the MR data corresponds to a plurality of slice locations;
program code for reconstructing a reduced field-of-view MR image for each slice location based on the MR data; and
program code for displaying the MR images.

16. A non-transitory computer readable storage medium according to claim 15, wherein the pulse sequence is a single shot echo planar imaging pulse sequence.

17. A non-transitory computer readable storage medium according to claim 16, wherein the pulse sequence is a diffusion weighted pulse sequence.

18. A non-transitory computer readable storage medium according to claim 15, wherein a separation distance between bands of the multiband RF refocusing pulse is equal to a separation distance between adjacent side lobes of the 2D echo-planar RF refocusing pulse.

19. A non-transitory computer readable storage medium according to claim 15, wherein the program code for reconstructing the MR images comprises program code for applying a parallel imaging technique.

20. A non-transitory computer readable medium according to claim 15, wherein the 2D echo-planar RF excitation pulse and the multiband RF refocusing pulse are configured to suppress signal from a spectral species which experiences chemical shift separation from a resonant frequency.

* * * * *